United States Patent [19]
Chen et al.

[11] Patent Number: 6,163,038
[45] Date of Patent: *Dec. 19, 2000

[54] WHITE LIGHT-EMITTING DIODE AND METHOD OF MANUFACTURING THE SAME

[75] Inventors: Chin-Yuan Chen, Hsinchu; Chao-Nien Huang, Hsinchu Hsien; Fei-Chang Hwang, Miaoli; Ming-Huang Hong; Eric G. Lean, both of Hsinchu, all of Taiwan

[73] Assignee: Industrial Technology Research Institute, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/078,882

[22] Filed: May 14, 1998

[51] Int. Cl.$^7$ .................................................. H01L 33/00
[52] U.S. Cl. ............................................ 257/103; 257/101
[58] Field of Search .............................. 257/103, 15, 101, 257/40

[56] References Cited

U.S. PATENT DOCUMENTS

| | | |
|---|---|---|
| 5,237,182 | 8/1993 | Kitagawa et al. . |
| 5,955,835 | 5/1999 | Oh et al. . |
| 5,998,803 | 12/1999 | Forrest et al. . |
| 5,998,925 | 12/1999 | Shimizu et al. . |

FOREIGN PATENT DOCUMENTS

| | | |
|---|---|---|
| 3-46280 | 2/1991 | Japan . |
| 7-3155 | 1/1995 | Japan . |
| 7-183576 | 7/1995 | Japan . |
| 8-097468 | 4/1996 | Japan . |
| 8-316528 | 11/1996 | Japan . |
| 9-232627 | 9/1997 | Japan . |

*Primary Examiner*—Stephen D. Meier
*Attorney, Agent, or Firm*—Harness, Dickey & Pierce, P.L.C.

[57] ABSTRACT

A white light-emitting diode and a method of fabricating the same diode are disclosed. The white light-emitting diode is fabricated by epitaxy, which can produce two peaks in the spectrum at the P-N junction by appropriately adjusting epitaxial parameters such as temperature, pressure, $NH_3$ flux and the ratio of $H_2$ to $N_2$ or the concentration of dopant, such as Mg or Si. The diode can thus radiate white light by adjusting the wavelength and the intensity of the principal peak in the two peaks. Further, quantum well structure can be formed in the diode. By appropriately adjusting the epitaxial parameters, the spectrum of the quantum well structures may have more than one peak. Therefore, white light can be generated by combining the light with wavelengths at two or three different peaks. The white LED can radiate white light itself and need not involve combining many LEDs, so that the cost and the difficulty of fabricating the white LED lamp can be reduced. Moreover, the white LED can radiate white light itself, and does not need to excite fluorescent material to radiate white light. Accordingly, the lifetime of the white LED lamp is not limited by the relatively short lifetime of fluorescent material.

43 Claims, 6 Drawing Sheets

WHITE LIGHT-EMITTING DIODE AND METHOD OF MANUFACTURING THE SAME

BACKGROUND OF THE INVENTION

1. Field of the Invention

The present invention relates to the structure of a light-emitting diode and the method of manufacturing the same, and more particularly to the structure of a white LED and its manufacturing method, which includes at least two energy bandgaps.

2. Description of Prior Art

Conventional LEDs normally emit pure monochromatic light due to the characteristics of single peak wavelength and full width of half maximum (FWHM). For example, an AlGaAs-based LED emits red light and a GaP-based LED emits green light. Moreover, by using different materials or different component ratios in the same system, LEDs of different colors and different brightness can be obtained. For instance, adjusting the P to As ratio in AsGaP or the Al to Ga and In ratio in AlGaInP can generate a highly bright AsGaP-based or AlGaInP-based LED which can emit red, yellow or green light. However, the above-described LED can only emit monochromatic light.

In practical terms, two kinds of LEDs that emit different colors, such as a red LED (R) and a green LED (G), can be combined to form a multi-colored LED display panel through adjusting the intensity ratio of red light and green light. Alternatively, three kinds of LEDs that emit different colors, such as a red LED (R), a green LED (G) and a blue LED (B), can be combined to form a full-colored display array of LEDs through adjusting the intensity ratio of red light, green light and blue light. Since the full-colored display panel can emit white light, the use of LEDs can be signal-indicating and advertising, as well as illumination. FIG. 1 illustrates a plan diagram for white LED light output, the pattern of white is No. NLK2015, manufactured by Nichia Chemical Industry of Japan. It is found that each pixel 10 consists of two red LEDs (R), two green LEDs (G) and one blue LED (B). Therefore, such a white light-emitting device is costly. Further, the design of the drive system is very complex because at least four electrical terminals are needed to change currents respectively flowing through different colors of LEDs, so that the intensity of each LED can be adjusted to produce white light. If one of the five LEDs suffers from light-output degradation, the color balance of the white light-emitting device is broken.

In order to reduce the cost, Nichia Chemical Industry provides another white LED lamp that does not require combining LEDs that emit red light, green light and blue light, respectively. Referring to FIG. 2, the white LED lamp includes a GaInN/GaN blue LED chip 12 and fluorescent material. The steps for fabricating the white LED lamp include placing an LED chip 12 on a metal pin 15a, connecting the surface electrode of the LED chip 12 to another metal pin 15b, filling fluorescent material 14 into the trough of the metal pin 15a to cover the LED chip 12, and then packaging the LED chip 12 and the ends of the metal pins 15a and 15b with packing material 16. The white LED lamp produces white light by compounding blue light emitted by the LED chip 12 and yellow light, which is generated by exciting the fluorescent material 14 with the blue light. This approach significantly reduces the cost of the white LED lamp and simplifies the drive system. However, the lifetime of the fluorescent material is only about 5000~10000 hours, far less than that of a white LED chip that is about 100000 hours, thus limiting the lifetime of such a white LED lamp.

SUMMARY OF THE INVENTION

Accordingly, to address the drawbacks of the prior arts mentioned above, the object of the present invention is to provide a white LED and a method of fabricating the white LED that can radiate white light itself by possessing at least two energy bandgaps in the structure of the LED.

One aspect of this invention is that the white LED can radiate white light itself and does not require combining many LEDs, so that the cost and the difficulty of fabricating the white LED lamp can be reduced.

Another aspect of this invention is that the white LED can radiate white light itself without having to excite the fluorescent material to produce the desired hue, therefore the lifetime of the white LED lamp is not affected by any limitation in the lifetime of fluorescent material.

This invention fabricates a diode by epitaxy, which can produce two peaks in the spectrum of the P-N junction by appropriately adjusting the epitaxial parameters, such as temperature, pressure, $NH_3$ flux and the ratio of $H_2$ to $N_2$ or the concentration of dopant, such as Mg or Si. The diode can thus radiate white light by adjusting the wavelength and the intensity of the principal peak in the two peaks.

Further, a quantum well structure can be formed in the diode. By appropriately adjusting the epitaxial parameters, the spectrum of quantum well may have more than one peak. Therefore, combining light with frequencies at two or three different peaks can generate white light.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

The white LED of the present invention uses a single LED chip to emit light at plural peaks of the spectrum. Then, if two peaks are combined to produce white light, the two peaks are normally at 430 nm and 560 nm. If three peaks are combined to produce white light, one of the peaks is normally in the range of 370~500 nm, another peak is in the range of 500~560 nm and the other is in the range of 620~700 nm. In other words, in any condition a light, which has a wavelength of about 370~500 nm or less, is necessary to serve as a base.

Figure 1:
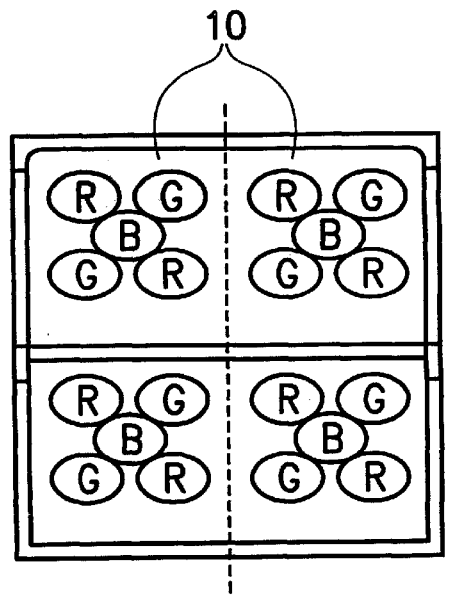
FIG. 1 is a plan view of the structure of a conventional white LED.
Figure 2:
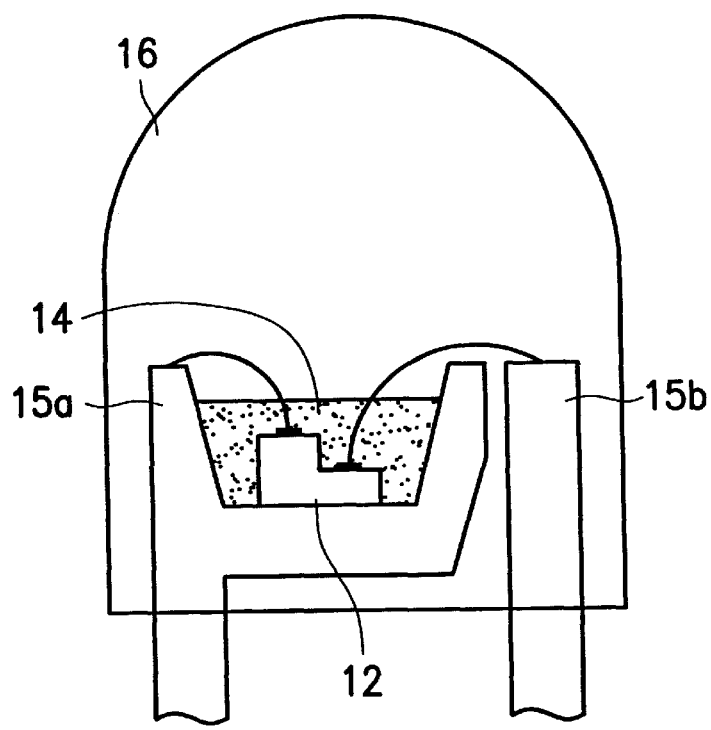
FIG. 2 is a plan view of the structure of another conventional white LED.
Figure 3A:
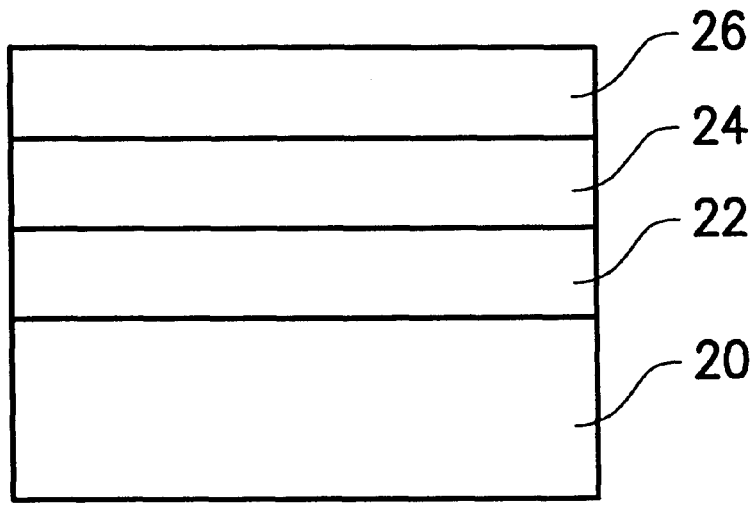
FIGS. 3a and 3b are cross-sections illustrating the process of manufacturing a white LED according to a first embodiment of this invention.
Figure 3B:
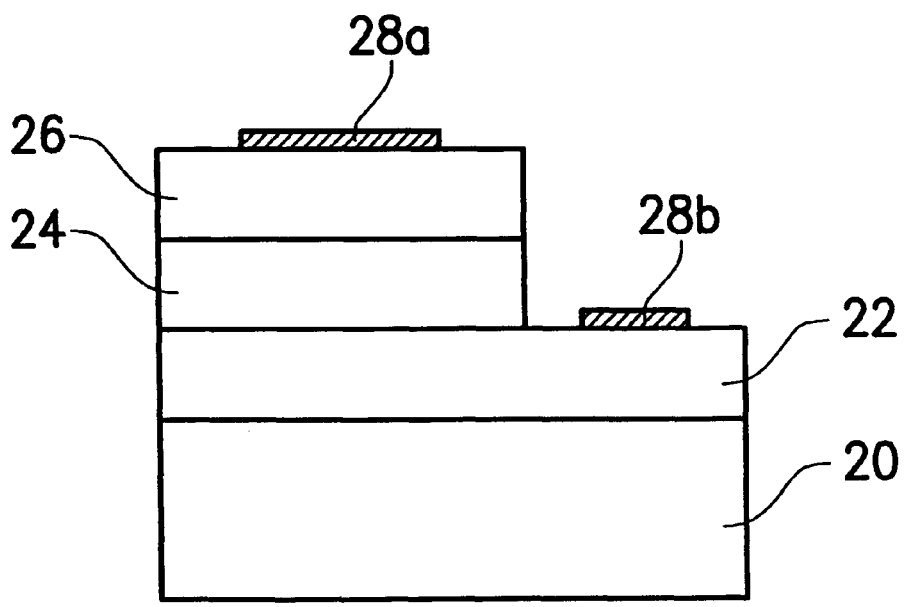

The process of manufacturing a white LED according to the first embodiment of this invention comprises the steps of: (1) Referring to FIG. 3a, by epitaxy such as metal-organic vapor-phase epitaxy (MOVPE), forming in order a first n-type GaN 22, a second n-type GaN 24 and a P-type GaN 26 on a substrate 20 such as sapphire; (2) referring to FIG. 3b, partially removing the second n-type GaN 24 and the p-type GaN 26 by photolithography and etching, and then forming a first electrode 28a and a second electrode 28b on the p-type GaN 26 and a first n-type GaN 22, respectively.

In the above epitaxial processes, the epitaxial temperature, the epitaxial pressure, the $NH_3$ flux, the ratio of $H_2$ to $N_2$, or the concentration of dopant such as Mg, Si can be adjusted to generate different energy band-gaps at the interfaces of the epitaxial layers 22, 24 and 26, especially at the interface of the epitaxial layers 24 and 26, which can produce a spectrum having two peaks when the external current is applied, one in the range of 370~450 nm and the other in the range of 500~600 nm.

Figure 4:
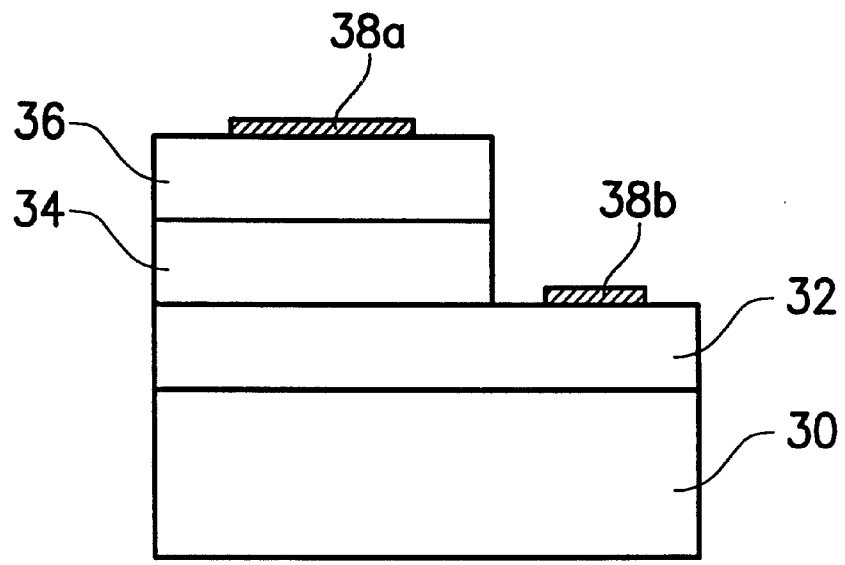
FIG. 4 is a cross-section illustrating the structure of a white LED according to a second embodiment of this invention.

The epitaxial layers of the white LED of this invention shown in FIG. 3 are a homogeneous structure made of GaN. However, AlGaN is used to replace the GaN material and form a double hetero-structure in the second embodiment of this invention. Referring to FIG. 4, the structure of the white LED includes a substrate 30; an n-type AlGaN 32 formed on the substrate 30 and being divided into a first section and a second section thereon; a n-type GaN 34 formed on the first section of the n-type AlGaN 32; a p-type AlGaN 36 formed on the n-type GaN 34; a first electrode 38a formed on the p-type AlGaN 36, but not completely covering the p-type AlGaN 36; and a second electrode 38b formed on the second section of the n-type AlGaN 32, but not completely covering the second section.

The epitaxial layers grown in the above embodiments have a spectrum with two peaks indicating blue light and yellow light in a certain epitaxial condition. The light emitted by the LED is a combination of blue light and yellow light, which is white light if the epitaxial parameters have been appropriately controlled. In the second embodiment, using n-type GaN to serve as the active layer in the double hetero-structure can increase the light-emitting efficiency of the white LED. Further, no indium is needed in the active layer, the white LED is fabricated by GaN only. The structure of this invention not only increases the light-emitting efficiency but also maintains low defects, because the lattice constant and the epitaxial temperature of AlGaN are very close to those of GaN.

Figure 5:
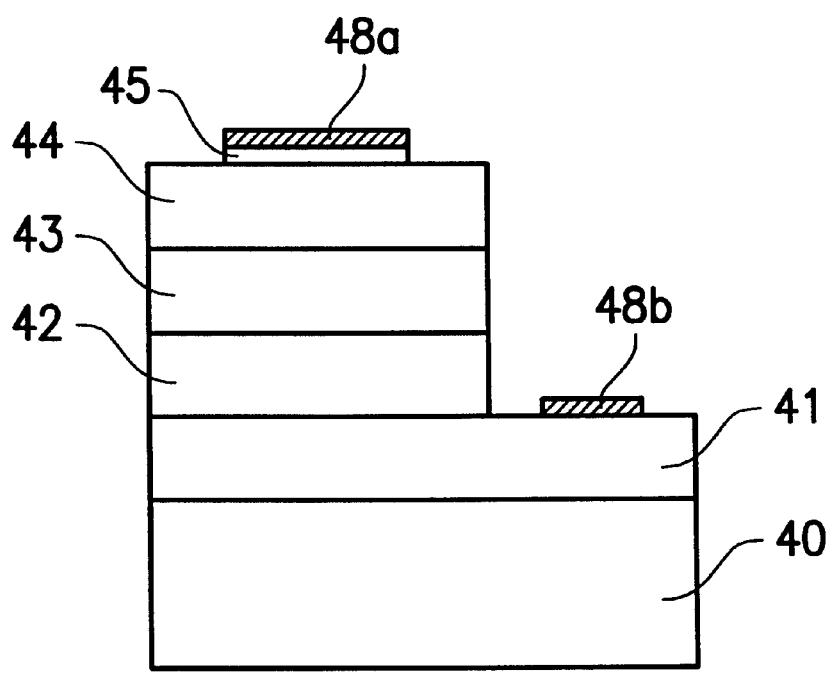
FIG. 5 is a cross-section illustrating the structure of a white LED according to a third embodiment of this invention.

The structure of the third embodiment of this invention is quite similar to that of the second embodiment, except for a GaN buffer layer and a p-type GaN. Refer to FIG. 5, the structure of the white LED according to the third embodiment includes: A substrate 40; a GaN buffer layer 41 formed on the substrate 40 and divided into a first section and a second section thereon; an n-type AlGaN 42 formed on the first section of the GaN buffer layer 41; an n-type GaN 43 formed on the n-type AlGaN 42; a p-type AlGaN 44 formed on the n-type GaN 43; a p-type GaN 45 formed on the p-type AlGaN 44, but not completely covering the p-type AlGaN 44; a first electrode 48a formed on the p-type GaN 45; and a second electrode 48b formed on the second section of the GaN buffer layer 41, but not thoroughly covering the second section. The above structure can provide a white LED of brighter intensity, lower operating voltage, and a longer lifetime.

Figure 6:
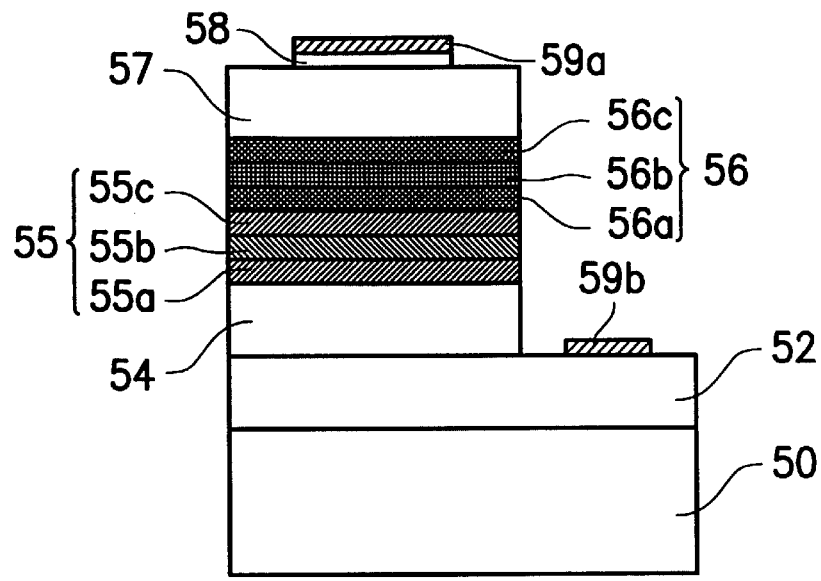
FIG. 6 is a cross-section illustrating the structure of a white LED according to a fourth embodiment of this invention.

In the above embodiments, different energy band-gaps are generated at the interfaces of the epitaxial layers by controlling the epitaxial parameters, so that the spectrum of an LED may contain two peaks. In the embodiments below, a quantum-well structure is applied in the LEDs. Different quantum wells can emit light of different wavelengths by adjusting the epitaxial parameters for growing quantum wells. Referring to FIG. 6, the fourth embodiment of this invention, which uses two quantum wells to serve as the active light-emitting layer, comprises: A substrate 50; a GaN buffer layer 52 formed on the substrate 50 and divided into a first section and a second section thereon; an n-type AlGaN 54 formed on the first section of the GaN buffer layer 52; a first InGaN quantum well 55 formed on the n-type AlGaN 54, which emits yellow light with a wavelength of about 550 to 620 nm; a second InGaN quantum well 56 formed on the first InGaN quantum well 55, which emits blue light with a wavelength of about 370 to 500 nm; a p-type AlGaN 57 formed on the second InGaN quantum well 56; a p-type GaN 58 formed on the p-type AlGaN 57, but not completely covering the p-type AlGaN 57; a first electrode 59a formed on the p-type GaN 58; and a second electrode 59b formed on, but not fully covering, the second section of the GaN buffer layer.

The first InGaN quantum well structure 55 includes an InGaN quantum-well layer 55b having a thickness of about 0.5 to 10 nm; and InGaN barrier layers 55a and 55c formed beside the InGaN quantum-well layer 55b, each of which has a thickness of about 5 to 100 nm. Similarly, the second InGaN quantum well structure 56 includes an InGaN quantum-well layer 56b having a thickness of about 0.5 to 10 nm and InGaN barrier layers 56a and 56c formed beside the InGaN quantum-well layer 56b, each of which has a thickness of about 5 to 100 nm. The formula of the InGaN barrier layers 55a and 55c can be $In_yGa_{1-y}N$ and the formula of the InGaN quantum-well layer 55b can be $In_zGa_{1-z}N$. Further, the formula of the InGaN barrier layers 56a and 56c can be $In_mGa_{1-m}N$ and the formula of the InGaN quantum-well layer 56b can be $In_nGa_{1-n}N$. Both of the n-type AlGaN 54 and the p-type AlGaN 57 can be represented as $Al_xGa_{1-x}N$. In addition, the following conditions, $1 \geq x > 0$; $1 \geq z > y \geq 0$ and $1 \geq n > m \geq 0$, must be met. Consequently, the first InGaN quantum well structure 55 emits yellow light, which has a wavelength longer than that of blue light emitted by the second InGaN quantum well structure 56.

Figure 7:
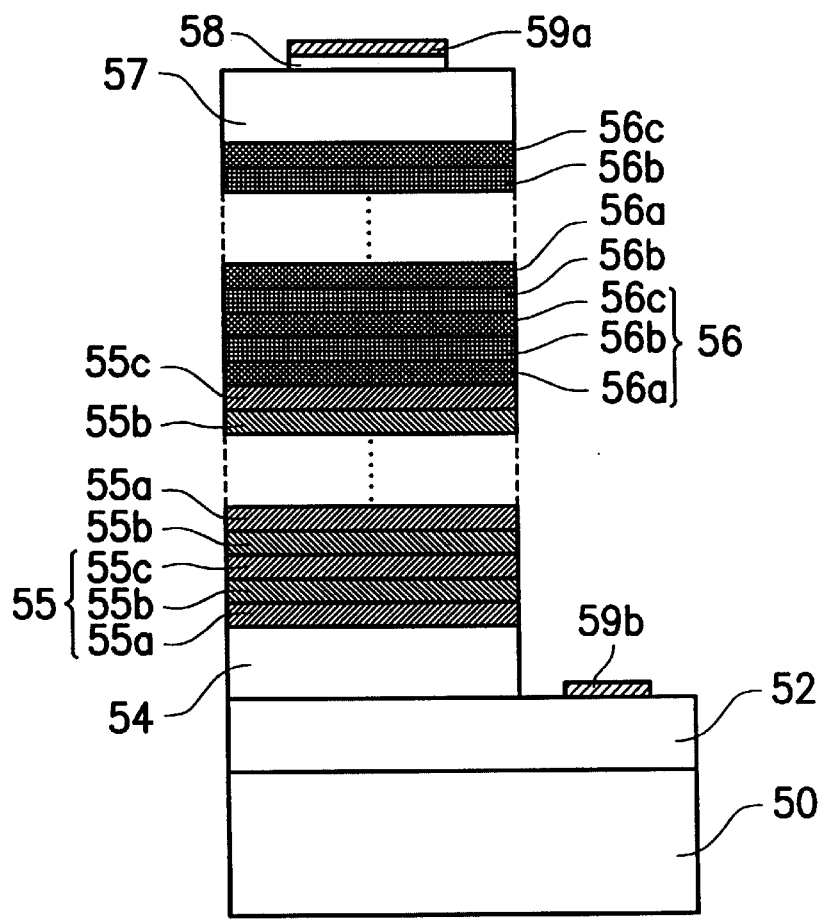
FIG. 7 is a cross-section illustrating the structure of a white LED according to a fifth embodiment of this invention.

To increase the brightness of white LED and to adjust the intensities of different peaks in the spectrum, the fifth embodiment uses a manufacturing process and parameters similar to those of the fourth embodiment but increases the number of the first InGaN quantum well structures 55 and the second InGaN quantum well structures 56. Refer to FIG. 7, each quantum well structure includes a plurality of quantum wells. The reference numbers used in FIG. 6 are also used in FIG. 7 to indicate the same components.

Figure 8:
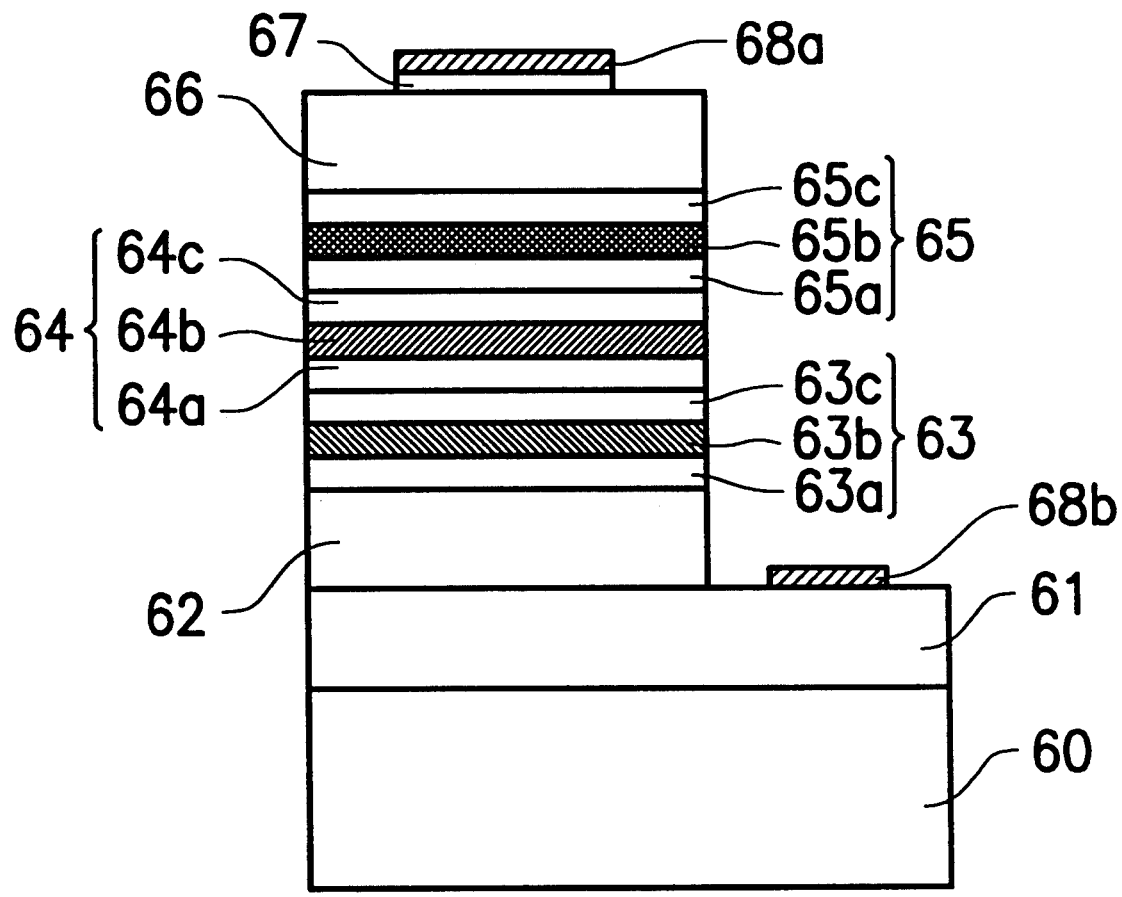
FIG. 8 is a cross-section illustrating the structure of a white LED according to a sixth embodiment of this invention.

The fourth and the fifth embodiments both use the peaks, one blue and the other yellow, in the spectrum to combine and produce white light. However, the two peaks can be substituted by three peaks, which contain a blue light, a green light and a red light. Referring to FIG. 8, the sixth embodiment of this invention, which includes three quantum well structures, consists of: A substrate 60; a GaN buffer layer 61 formed on the substrate 60 and divided into a first section and a second section thereon; an n-type AlGaN 62 formed on the first section of the GaN buffer layer 61; a first InGaN quantum well structure 63 formed on the n-type AlGaN 62 and able to emit light with a wavelength of 570 to 640 nm; a second InGaN quantum well structure 64 formed on the first InGaN quantum well structure 63 and able to emit light with a wavelength of 500 to 555 nm; a third InGaN quantum well structure 65 formed on the second InGaN quantum well structure 64 and able to emit light with a wavelength of 370 to 500 nm; a p-type AlGaN 66 formed on the third InGaN quantum well structure 65; a p-type GaN 67 formed on the p-type AlGaN 66; a first electrode 68a formed on the p-type GaN 67; and a second electrode 68b formed on the second section of the GaN buffer layer 61, but not completely covering the second section.

The first InGaN quantum well structure 63 includes: An InGaN quantum-well layer 63b having a thickness of about 0.5 to 10 nm; and InGaN barrier layers 63a and 63c formed beside the InGaN quantum-well layer 63b, each of which has a thickness of about 5 to 100 nm. Similarly, the second InGaN quantum well structure 64 includes an InGaN quantum-well layer 64b having a thickness of about 0.5 to 10 nm; and InGaN barrier layers 64a and 64c formed beside the InGaN quantum-well layer 64b, each of which has a thickness of about 5 to 100 nm. The third InGaN quantum well structure 65 includes an InGaN quantum-well layer 65b having a thickness of about 0.5 to 10 nm; and InGaN barrier layers 65a and 65c formed beside the InGaN quantum-well layer 65b, each of which has a thickness of about 5 to 100 nm. The formula of the InGaN barrier layers 63a and 63c can be $In_yGa_{1-y}N$ and the formula of the InGaN quantum-well layer 63b can be $In_zGa_{1-z}N$. The formula of the InGaN barrier layers 64a and 64c can be $In_mGa_{1-m}N$ and the formula of the InGaN quantum-well layer 64b can be $In_nGa_{1-n}N$. Further, the formula of the InGaN barrier layers 65a and 65c can be $In_pGa_{1-p}N$ and the formula of the InGaN quantum-well layer 65b can be $In_qGa_{1-q}N$. Both of the n-type AlGaN 62 and the p-type AlGaN 66 can be represented as $Al_xGa_{1-x}N$. In addition, the following conditions, $1 \geq x > 0$; $1 \geq z > y \geq 0$; $1 \geq n > m \geq 0$; and $1 \geq q > p \geq 0$, must be met. Consequently, the first InGaN quantum well structure 63 emits red light of a wavelength longer than that of green light emitted by the second InGaN quantum well structure 64. Therefore, the light emitted by the first InGaN quantum well structure 63 will not be absorbed by the second InGaN quantum well structure 64. And the third InGaN quantum well structure 65 emits blue light of a wavelength shorter than that of the second InGaN quantum well structure 64. Consequently, the third InGaN quantum well structure 65 can not absorb the light emitted by the second InGaN quantum well structure 64.

Figure 9:
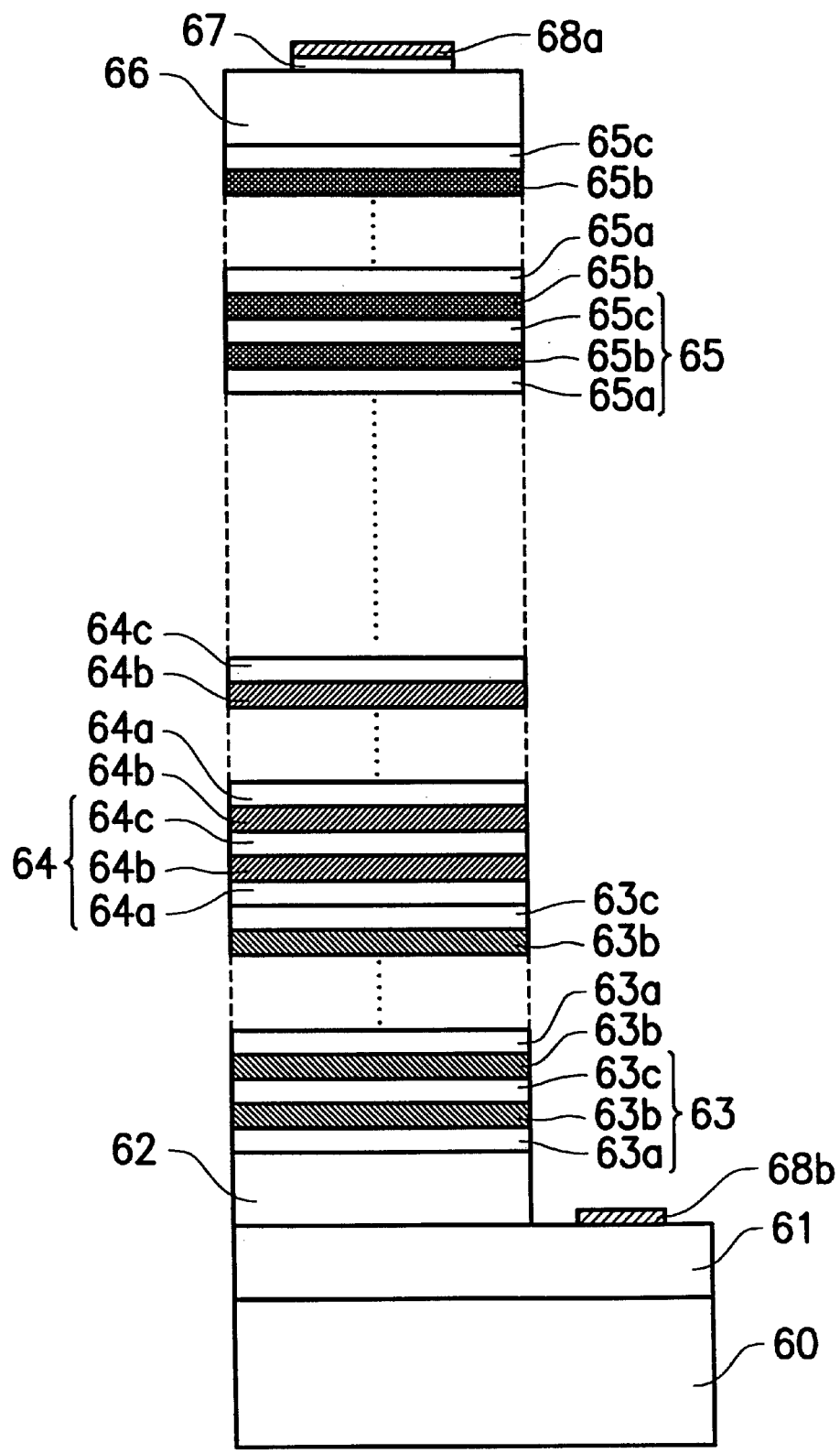
FIG. 9 is a cross-section illustrating the structure of a white LED according to a seventh embodiment of this invention.

Referring to FIG. 9, the seventh embodiment continues using the process and parameters used in the sixth embodiment, but increases the number of quantum wells in each quantum well structure. That is, each quantum well structure includes a plurality of quantum wells.

It is required that the quantum well structure that emits a light having a longer wavelength is always grown first in the light-emitting direction.

The intensity of the light emitted by a quantum well structure is in proportion to the number of the quantum wells included. Furthermore, the number of the quantum well structures is not limited in 2 or 3 as described in the above embodiments. Practically, the number of the quantum well structures need not to be larger than 30. A preferred number of the quantum well structures is 15.

Regarding to the epitaxial parameters used in the above embodiments, taking the processes of MOVPE for example, the range of each epitaxial parameter used in this invention is given below. The epitaxial temperature is between 900° C.~1200° C. The epitaxial pressure is between 20 millibars to 1000 millibars. The flux of NH3 is in a range of around 0.5 slm to 20 slm. The flux of TMG is in a range of about 2 sccm to 100 sccm. The dopant can be Zn, Mg, C, Hg, Cd, Be, Si, S or Se, etc. The doping concentration is about $1 \times 10^{17}$ to $1 \times 10^{19}$ cm$^{-3}$ for Mg.

Further, instead of GaN or InGaN material, other IV—IV group compound, III–V group compound or II–VI group compound semiconductors, such as SiC, AlN, BN, ZnSe, ZnSeS and so on, can be used to fabricate white LEDs.

What is claimed is:

1. A white light-emitting diode comprising:

a substrate;

a first layer of n-type semiconductor formed on the substrate and being divided into a first section and a second section;

a second layer of n-type semiconductor formed on the first section of the first layer of n-type semiconductor;

a p-type semiconductor formed on the second layer of n-type semiconductor;

a first electrode partially formed on the p-type semiconductor;

a second electrode partially formed on the second section of the first layer of n-type semiconductor, such that when a current flows between the first electrode and the second electrode, a spectrum generated by an interface of the second layer of n-type semiconductor and the p-type semiconductor includes at least two peaks that can combine to produce white light.

2. A white light-emitting diode as claimed in claim 1 wherein the n-type semiconductor and the p-type semiconductor are GaN.

3. A white light-emitting diode as claimed in claim 1 wherein the n-type semiconductor and the p-type semiconductor are AlGaN.

4. A white light-emitting diode comprising:

a substrate;

a buffer layer formed on the substrate and being divided into a first section and a second section;

a first n-type semiconductor formed on the first section of the buffer layer;

a second n-type semiconductor formed on the first n-type semiconductor;

a first p-type semiconductor formed on the second n-type semiconductor;

a second p-type semiconductor partially formed on the first n-type semiconductor;

a first electrode formed on the second p-type semiconductor; and a second electrode partially formed on the second section of the buffer layer.

5. A white light-emitting diode as claimed in claim 4 wherein the buffer layer is made of GaN.

6. A white light-emitting diode as claimed in claim 4 wherein the first n-type semiconductor is n-type AlGaN.

7. A white light-emitting diode as claimed in claim 4 wherein the second n-type semiconductor is n-type GaN.

8. A white light-emitting diode as claimed in claim 4 wherein the first p-type semiconductor is p-type AlGaN.

9. A white light-emitting diode as claimed in claim 4 wherein the second p-type semiconductor is p-type GaN.

10. A white light-emitting diode comprising:
a substrate;
a buffer layer formed on the substrate and being divided into a first section and a second section;
an n-type semiconductor formed on the first section of the buffer layer;
a first quantum well structure formed on the n-type semiconductor, which can emit a light having a wavelength of about 550 to 620 nm;
a second quantum well structure formed on the first quantum well structure, which can emit a light having a wavelength of about 370 to 500 nm;
a first p-type semiconductor formed on the second quantum well structure;
a second p-type semiconductor partially formed on the first p-type semiconductor;
a first electrode formed on the second p-type semiconductor; and
a second electrode partially formed on the second section of the buffer layer.

11. A white light-emitting diode as claimed in claim 10 wherein the buffer layer is made of GaN.

12. A white light-emitting diode as claimed in claim 10 wherein the n-type semiconductor is n-type AlGaN.

13. A white light-emitting diode as claimed in claim 10 wherein the first quantum well structure and the second quantum well structure are InGaN quantum well structures.

14. A white light-emitting diode as claimed in claim 10 wherein the first p-type semiconductor is p-type AlGaN.

15. A white light-emitting diode as claimed in claim 10 wherein the second p-type semiconductor is p-type GaN.

16. A white light-emitting diode as claimed in claim 12 wherein the formula of the n-type AlGaN is $Al_xGa_{1-x}N$ where $1 \geq x > 0$.

17. A white light-emitting diode as claimed in claim 14 wherein the formula of the p-type AlGaN is $Al_xGa_{1-x}N$ where $1 \geq x > 0$.

18. A white light-emitting diode as claimed in claim 13 wherein the first quantum well structure includes an InGaN quantum-well layer and InGaN barrier layers formed beside the InGaN quantum-well layer.

19. A white light-emitting diode as claimed in claim 13 wherein the second quantum well structure includes an InGaN quantum-well layer and InGaN barrier layers formed beside the InGaN quantum-well layer.

20. A white light-emitting diode as claimed in claim 13 wherein the first quantum well structure includes a plurality of InGaN quantum-well layers and InGaN barrier layers formed beside each of the plurality of InGaN quantum-well layers.

21. A white light-emitting diode as claimed in claim 13 wherein the second quantum well structure includes a plurality of InGaN quantum-well layers and InGaN barrier layers formed beside each of the plurality of InGaN quantum-well layers.

22. A white light-emitting diode as claimed in claim 18 or 20 wherein the formula of the InGaN quantum-well layer is $In_zGa_{1-z}N$ and the formula of the InGaN barrier layer is $In_yGa_{1-y}N$ where $1 \geq z > y \geq 0$.

23. A white light-emitting diode as claimed in claim 19 or 21 wherein the formula of the InGaN quantum-well layer is $In_nGa_{1-n}N$ and the formula of the InGaN barrier layer is $In_mGa_{1-m}N$ where $1 \geq n > m \geq 0$.

24. A white light-emitting diode as claimed in claim 22 wherein the thickness of the InGaN quantum-well layer is in a range of 0.5 to 10 nm and the thickness of the InGaN barrier layer is in a range of 5 to 100 nm.

25. A white light-emitting diode as claimed in claim 23 wherein the thickness of the InGaN quantum-well layer is in a range of 0.5 to 10 nm and the thickness of the InGaN barrier layer is in a range of 5 to 100 nm.

26. A white light-emitting diode comprising:
a substrate;
a buffer layer formed on the substrate and being divided into a first section and a second section;
an n-type semiconductor formed on the first section of the buffer layer;
a first InGaN quantum well structure formed on the n-type semiconductor, which can emit a light having a wavelength of about 570 to 650 nm;
a second InGaN quantum well structure formed on the first InGaN quantum well structure, which can emit a light having a wavelength of about 500 to 555 nm;
a third InGaN quantum well structure formed on the second InGaN quantum well structure, which can emit a light having a wavelength of about 370 to 500 nm;
a first p-type semiconductor formed on the third InGaN quantum well structure;
a second p-type semiconductor partially formed on the first p-type semiconductor;
a first electrode formed on the second p-type semiconductor; and
a second electrode partially formed on the second section of the buffer layer.

27. A white light-emitting diode as claimed in claim 26 wherein the buffer layer is made of GaN.

28. A white light-emitting diode as claimed in claim 26 wherein the n-type semiconductor is n-type AlGaN.

29. A white light-emitting diode as claimed in claim 26 wherein the first p-type semiconductor is p-type AlGaN.

30. A white light-emitting diode as claimed in claim 26 wherein the second p-type semiconductor is p-type GaN.

31. A white light-emitting diode as claimed in claim 26 wherein the first quantum well structure, the second quantum well structure and the third quantum well structure are InGaN quantum well structures, and each quantum well structure includes at least one InGaN quantum-well layer and InGaN barrier layers formed beside the InGaN quantum-well layer.

32. A white light-emitting diode as claimed in claim 28 wherein the formula of the n-type AlGaN is $Al_xGa_{1-x}N$, where $1 \geq x > 0$.

33. A white light-emitting diode as claimed in claim 29 wherein the formula of the p-type AlGaN is $Al_xGa_{1-x}N$, where $1 \geq x > 0$.

34. A white light-emitting diode as claimed in claim 31 wherein the formula of the InGaN quantum-well layer is $In_zGa_{1-z}N$ and the formula of the InGaN barrier layer is $In_yGa_{1-y}N$, where $1 \geq z > y \geq 0$ in the first quantum well structure.

35. A white light-emitting diode as claimed in claim 31 wherein the formula of the InGaN quantum-well layer is $In_nGa_{1-n}N$ and the formula of the InGaN barrier layer is $In_mGa_{1-m}N$, where $1 \geq n > m \geq 0$ in the second quantum well structure.

36. A white light-emitting diode as claimed in claim 31 wherein the formula of the InGaN quantum-well layer is $In_qGa_{1-q}N$ and the formula of the InGaN barrier layer is $In_pGa_{1-p}N$, where $1 \geq q > p \geq 0$ in the third quantum well structure.

37. A white light-emitting diode as claimed in claim 31 wherein the thickness of the InGaN quantum-well layer is in a range of 0.5 to 10 nm and the thickness of the InGaN barrier layer is in a range of 5 to 100 nm.

38. A white light-emitting diode comprising:

a substrate;

a buffer layer formed on the substrate and being divided into a first section and a second section;

an n-type semiconductor formed on the first section of the buffer layer;

a plurality of InGaN quantum well structures formed on the n-type semiconductor, in which an InGaN quantum well structure that emits light of a longer wavelength is grown first on the n-type semiconductor, then sequentially growing InGaN quantum well structures that emit light of a relatively shorter wavelength;

a first p-type semiconductor formed on the plurality of InGaN quantum well structures;

a second p-type semiconductor partially formed on the first p-type semiconductor;

a first electrode formed on the second p-type semiconductor; and a second electrode partially formed on the second section of the buffer layer.

39. A white light-emitting diode as claimed in claim 38 wherein each of the plurality of quantum well structures includes at least one InGaN quantum-well layer and InGaN barrier layers formed beside the InGaN quantum-well layer.

40. A white light-emitting diode as claimed in claim 38 wherein the number of the plurality of quantum well structures is between 3 and 30.

41. A white light-emitting diode as claimed in claim 38 wherein the number of the plurality of quantum well structures is preferably 15.

42. A white light-emitting diode as claimed in claim 39 wherein the thickness of the InGaN quantum-well layer is in a range of 0.5 to 10 nm and the thickness of the InGaN barrier layer is in a range of 5 to 100 nm.

43. A white light-emitting diode as claimed in claim 39 wherein the InGaN quantum-well layer has a larger In composition than the InGaN barrier layers.

* * * * *